United States Patent [19]

Ohsawa

[11] Patent Number: 5,399,504
[45] Date of Patent: Mar. 21, 1995

[54] METHOD OF MANUFACTURING CUINSE₂ THIN FILM SOLAR CELL

[75] Inventor: Michio Ohsawa, Kanagawa, Japan

[73] Assignee: Fuji Electric Corporate Research & Development Ltd., Kanagawa, Japan

[21] Appl. No.: 222,362

[22] Filed: Apr. 4, 1994

Related U.S. Application Data

[63] Continuation of Ser. No. 888,030, May 25, 1992, abandoned.

[30] Foreign Application Priority Data

May 27, 1991 [JP] Japan ................... 3-102522
Nov. 21, 1991 [JP] Japan ................... 3-305155

[51] Int. Cl.⁶ .................. H01L 31/18; H01L 31/072
[52] U.S. Cl. .......................... 437/5; 437/8; 136/265; 136/290
[58] Field of Search ............. 437/5, 8, 173; 136/260, 136/264, 265; 427/74, 76

[56] References Cited

U.S. PATENT DOCUMENTS

| | | | |
|---|---|---|---|
| 4,611,091 | 9/1986 | Choudary et al. | 136/260 |
| 4,684,761 | 8/1987 | Devaney | 136/258 |
| 5,078,804 | 1/1992 | Chen et al. | 136/260 |
| 5,112,410 | 5/1992 | Chen | 136/260 |

FOREIGN PATENT DOCUMENTS

| | | | |
|---|---|---|---|
| 3822073A1 | 1/1990 | Germany | 136/265 |
| 3911965A1 | 10/1990 | Germany | . |
| 4103291C2 | 9/1992 | Germany | 136/265 |

OTHER PUBLICATIONS

"Characterization of Copper Indium Diselenide Thin Films by Raman Scattering Spectroscopy for Solar Cell Applications", Japanese Journal of Applied Physics, vol. 28, No. 8, Aug., 1989, pp. L 1337-L 1340.

"Semiconductor Material and Device Characterization", John Wiley & Sons, Inc., New York, 1990, pp. 490-497.

"Enhanced Photocurrent ZnO/CdS/CuInSe₂ Solar Cells", Solar Cells, vol. 16 (1986), 521-527.

"Transport mechanisms in ZnO/CdS/CuInSe₂ solar cells", J. Appl. Phys. vol. 68(9), 1 Nov. 1999, pp. 4694-4699.

Patent Abstracts of Japan, vol. 6, No. 162, Aug. 25, 1982, p. 137.

Patent Abstracts of Japan, vol. 13, No. 329, Jul. 25, 1989, p. 904.

"Study of CuInSe₂ Formation Kinetics in the Selenization Process by Raman Spectroscopy", Japanese Journal of Applied Physics, vol. 30, No. 3, Mar. 1991, pp. 442-446.

"Voltage and light bias-dependent spectral response of the CuInSe₂/Cd(Zn)S thin-film solar cell", J. Appl. Phys. vol. 60(6), Sep. 15, 1986, pp. 2133-2136.

(List continued on next page.)

*Primary Examiner*—Aaron Weisstuch
*Attorney, Agent, or Firm*—Finnegan, Henderson Farabow, Garrett & Dunner

[57] ABSTRACT

The quality of CuInSe₂ solar cells is estimated during the manufacturing process by using a photoluminescence analysis. Emitted luminescence is measured upon irradiation of a CuInSe₂ thin film with laser light, and estimation is performed on the basis of the luminous intensity. Specifically, non-defective products can be obtained by using lots in which the maximum luminous intensity in the spectral range of luminescent light of 0.8~0.9 eV of a sample cooled to liquid nitrogen-temperature or to liquid helium temperature is not lower than a predetermined value or is higher than the maximum luminous intensity in the spectral range of 0.9~1.0 eV. Further, after the manufacturing process is completed, by using this estimation, it is possible to rank the products after completion of the manufacturing process.

20 Claims, 4 Drawing Sheets

OTHER PUBLICATIONS

"CuInSe$_2$ films and solar cells obtained by selenization of evaporated Cu–In layers", Appl. Phys. Lett. vol. 54(19), May 89, 1989, pp. 1918–1919.

"Interface properties of (Cd,Zn)S/CuInSe$_2$ single-crystal solar cells", J. Vac. Sci. Technol. vol. A7(3), May/Jun. 1989, pp. 837–841.

"Thin Film Tandem Solar Cells Based on CuInSe$_2$", Solar Cells, vol. 16 (1986), 447–455.

R. E. Hollingsworth and J. R. Sites, Annealing Temperature Effects On CuInSe$_2$/CdS Solar Cells; *Solar Cells,* 16, (1986) pp. 457–477 month not known.

F. A. Abou-Elfotouh et al, Characterization of the defect levels in copper indium diselenide; *Solar Cells,* 30, (1991) pp. 151–160 month not known.

Fouad A. Abou-Elfotouh et al, Determination and observation of electronic defect levels in CuInSe$_2$ crystals and thin films; *J. Vac. Sci. Technol.* A9 (3), May/Jun. 1991 pp. 554–558 month not known.

K. Urabe et al, Properties of CuInSe$_2$ Films For Solar Cell Applications *Proc. 22th IEEE Photovolt. Specialists Conference,* Oct. 7–10, 1991 month not known.

F. A. Abou-Elfotouh et al, *Conference Record, 21st IEEE Photovoltaic Specialists Conf.* (1990, May), pp. 541–545.

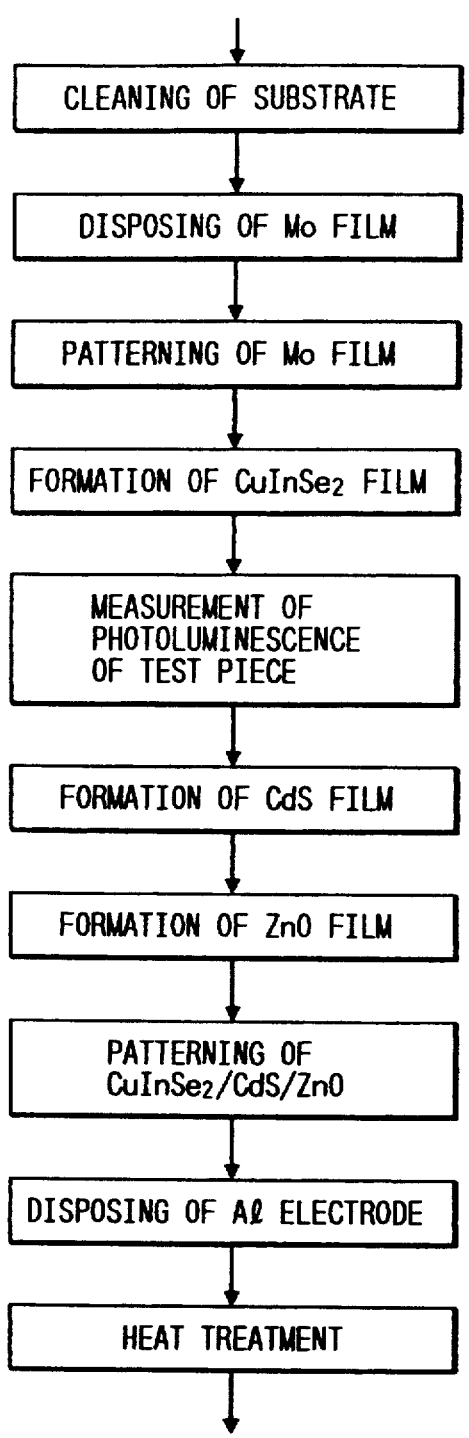
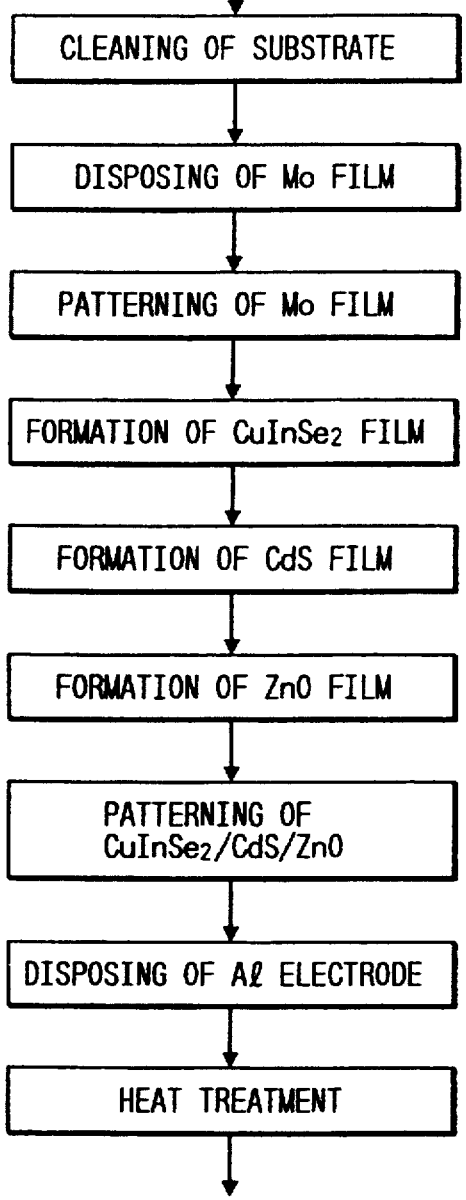

METHOD OF MANUFACTURING CUINSE$_2$ THIN FILM SOLAR CELL

This application is a continuation of application Ser. No. 07/888,030, filed May 26, 1992, now abandoned.

BACKGROUND OF THE INVENTION

1. Field of the Invention

The present invention relates to a CuInSe$_2$ based thin film solar cells using a thin film CuInSe$_2$ based compound semiconductor active layer, and a manufacturing method thereof.

2. Description of the Prior Art

CuInSe$_2$ based thin film solar cells are expected to be used in inexpensive and large-sized solar cells similar to amorphous silicon (a-Si) thin film solar cells. Since CuInSe$_2$ has a narrow optical band gap Eg of about 1.0 eV, it can photoelectrically convert light having long wavelengths. Such photoelectric conversion cannot be achieved in an a-Si solar cell film because a-Si has an optical band gap Eg of about 1.7 eV. Accordingly, it is desirable to provide an a-Si solar cell and a CuInSe thin film solar cell laminated together in order to form a high efficiency tandem thin film solar cell which can photoelectrically convert light of both short and long wavelengths.

FIG. 2 shows the structural components of a CuInSe$_2$ thin film solar cell related to the present invention. The CuInSe$_2$ thin film solar cell includes a readily available glass plate 1 having a smooth surface. Mo thin film 2 is deposited on a smooth upper-surface of glass plate 1 and serves as a back-surface electrode. A P-type CuInSe$_2$ film 3 having a thickness of approximately 1~4 μm is formed on Mo thin film 2. A transparent conductive n-type CdS or CdZnS film 4 having a thickness of about 0.05~0.1 μmm is formed on P-type CuInSe$_2$ film 3. A photovoltage generated when light 9 impinges upon this laminated structure is applied to a load 8 through terminals 6 and 7. Terminals 6 and 7 are provided on back-surface electrode 2 and on a ZnO film 5, respectively.

In manufacturing the above described CuInSe$_2$ solar cell, the most important step involves forming the CuInSe$_2$ film 3 active layer. Various methods have been proposed for making the CuInSe$_2$ active layer, such as a three-source simultaneous-deposition method, a spraying method, a two-stage selenidation method, a selenidation method using H$_2$Se, a sputtering method, and an electrodeposition method. Of these methods, the three-source simultaneous-evaporation method, described by Nakata et al. in the magazine "Material Science", Vol. 25, p. 168 (1988), yields CuInSe$_2$ solar cells having good characteristics. The three-source simultaneous-evaporation method requires a deposition apparatus having a vacuum tank which includes Cu, In, and Se evaporation sources. Cu, In, and Se are evaporated simultaneously from their respective evaporation sources and deposited on a substrate heated to 350°~400° C. In this method, as well as in the above mentioned methods, it is important to control the composition of Cu, In, and Se in the CuInSe$_2$ film to be formed.

FIG. 3 shows a process of manufacturing a conventional CuInSe$_2$ thin film solar cell. In the last step of this process, after the CdS film is formed on the CuInSe$_2$ layer, heat treatment is performed at about 200° C. in O$_2$ gas or air.

The present inventor fabricated CuInSe$_2$ thin film solar cells having the structure shown in FIG. 2 using the three-source simultaneous-evaporation method incorporating the steps listed in FIG. 3. However, these CuInSe$_2$ thin film solar cells were defective because the quality and characteristics of the CuInSe$_2$ films employed varied depending upon the film-formation lots. Some of the CuInSe$_2$ films had good characteristics while others had poor characteristics, even though the compositions of the CuInSe$_2$ films were substantially the same. The composition distribution in a direction perpendicular to the plane of deposition of the CuInSe$_2$ film (i.e. in a direction parallel to the thickness of the CuInSe$_2$ film) was measured by an ion micro-analyzer, the composition distribution in the film surface was measured by an electron probe micro-analyzer, and the shape of the film surface was observed by a scanning-type electron microscope. The CuInSe$_2$ crystal structure was inspected through X-ray diffraction or laser Raman spectroscopy, and quantitative analysis of the composition of the film was performed through ICP plasma light-emission analysis. None of these analytical methods, however, could differentiate between films having good and bad characteristics. Details of the process used to make the CuInSe$_2$ thin film solar cell of FIG. 2 will be described below.

Back-surface electrode 2, having a thickness of 1.0 μmm, was formed on glass substrate 1 by sputtering. P-type CuInSe$_2$ thin film 3 was then deposited on back-surface electrode 2. P-type CuInSe$_2$ thin film 3 has a two-layer structure slightly varying in composition. The overall thickness of p-type CuInSe$_2$ thin film 3 is approximately 2~4 μm. The substrate temperature during deposition of the first layer of p-type CuInSe$_2$ film was 350° C. and the Cu/In ratio was 1.1. The substrate temperature during deposition of the second layer of the CuInSe2 film was 450° C. and the Cu/In ratio was 0.7. The average composition of the resulting two-layer CuInSe$_2$ film was chemically analyzed through the ICP plasma light-emission analysis. As a result, in many CuInSe$_2$ lots, Cu/In and Se/(Cu+In) were substantially constant so that Cu/in=0.85~1.0 and Se/(Cu+In)=1.0~1.1. The n-type CdS film 4 was formed by electron beam deposition to a thickness of about 0.1 μm. ZnO film 5 was formed by sputtering of a ZnO target containing 2%–3% Al$_2$O$_3$ and deposited to a thickness of about 1 μm. Heat treatment was performed in dry air at 230° C. for 2~10 hours.

The characteristic, that is, the conversion efficiency of the CuInSe$_2$ thin film solar cells manufactured in the manner described above, showed values which varied significantly depending on the formation lots of the CuInSe$_2$ films. Even in lots having substantially constant compositions of Cu/In=0.85~1.0 and Se/(Cu+In)=1.0~1.1, as determined by the chemical analysis of the CuInSe$_2$, some of the solar cells had good conversion efficiency (η) values of about 10% while others had extremely poor values of <0.1%. Table 1 shows the composition of CuInSe$_2$ films and values of cell characteristics (good and bad conversion efficiencies η) for each of six lots in which the ratios of the constituent elements Cu/In and Se/(Cu+In) were varied within the ranges of 8.5~1.0 and 1.0~1.1, respectively.

TABLE 1

| CuInSe$_2$ Film Forming Lot No. | CuInSe$_2$ Film Composition (Analyzed Value) | | Solar Cell Characteristic | |
|---|---|---|---|---|
| | Cu/In | Sn/(Cu + In) | good/bad | conv. eff. $\eta$ |
| IC-112 | 0.978 | 1.03 | good | 9.3% |
| IC-114 | 0.877 | 1.038 | bad | <0.1% |
| IC-115 | 0.927 | 1.02 | bad | <0.1% |
| IC-121 | 0.956 | 1.015 | good | 11.0% |
| IC-125 | 0.959 | 1.033 | bad | <0.1% |
| IC-138 | 0.911 | 1.054 | good | 10.0% |

For each of the six lots of the CuInSe$_2$ films, in addition to the chemical analysis of the composition, vertical elemental-distribution analysis using an .ion microanalyzer, element in-surface distribution analysis using an electron probe micro-analyzer, surface-shape observation using a scanning-type electron microscope, and crystal-structure observational studies through X-ray diffraction and laser Raman spectroscopy were also performed. However, none of the analytical methods could predict whether the characteristics of the CuInSe$_2$ solar cell (i.e., conversion efficiency) would be good or bad.

SUMMARY OF THE INVENTION

It is an object of the present invention to solve the problems described above and to provide a CuInSe$_2$ based thin film solar cell and a method for making thereof in which the ratio of non-defective to defective products can be improved by effectively estimating the characteristics of the CuInSe$_2$ based thin film solar cell after the CuInSe$_2$ based film has been formed.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

In order to achieve the above object, the CuInSe$_2$ based thin film solar cell according to the present invention has a CuInSe$_2$ based thin film, having a maximum luminous intensity in a range of 0.8~0.9 eV, of a spectrum of luminescence radiation emitted when the thin film solar cell is irradiated with light having photon energy not less than 1.0 eV at a predetermined temperature, has a value not lower than a predetermined value. Alternatively, the CuInSe$_2$ based thin film solar cell has a CuInSe$_2$ based thin film, wherein the maximum luminous intensity, in a range of 0.8~0.9 eV, of a spectrum of luminescence radiation emitted when the thin film solar cell is irradiated with light having photon energy not less than 1.0 eV at a predetermined temperature, is higher than that in a range of 0.9~1.0 eV. Further, the CuInSe$_2$ based thin film solar cell has a substrate including opposing surface layers, at least one of which is conductive, a CuInSe$_2$ based thin film formed on the one conductive, surface layer of the substrate, a CdS or CdZnS thin film laminated on the CuInSe$_2$ based thin film and forming a junction between the CdS or CdZnS thin film and the CuInSe$_2$ based thin film, and a ZnO thin film formed on the CdS or CdZnS thin film, such that when the thin film solar cell is irradiated with light having photo-electron energy not less than 1.0 eV, the maximum luminous intensity, in a spectral range of luminous radiation of 0.8~0.9 eV, exceeds a predetermined value or is greater than the maximum luminous intensity in the spectral range of 0.9~1.0 eV. Preferably, the predetermined temperature has a value not less than a predetermined value and is selected to be in the range of 67~87K in one embodiment of the invention or, in another embodiment of the invention, selected to be not higher than 10K.

In the method of manufacturing a CuInSe$_2$ based thin film solar cell according to-the present invention, estimation of the characteristics of a CuInSe$_2$ based thin film active layer in a solar cell is performed on the basis of a result of measurement of luminous intensity of luminescent radiation emitted when the thin film is irradiated with light having a photon energy not less than 1.0 eV at a predetermined temperature. The irradiation for the photoluminescent analysis can be performed on the exposed CuInSe$_2$ based film, through a CdS or CdZnS thin film formed on the CuInSe$_2$ based thin film on the conductive surface of the substrate at least one of whose surfaces is conductive, or through a ZnO thin film further formed on the CdS or CdZnS thin film. After completion of the step of forming the CuInSe$_2$ based thin film on the conductive surface layer of the substrate at least one of whose surfaces is conductive, a CuInSe$_2$ based thin film sample produced at the same time is cooled to the temperature of liquid nitrogen. The sample is then irradiated with laser light so that luminescence radiation emitted from the sample may be measured. Processing of the CuInSe$_2$ based thin film solar cell is continued through successive steps if the maximum luminous intensity, in a spectral range of 0.8~0.9 eV of the luminescence light, exceeds a predetermined value or is greater than the maximum luminous intensity in the spectral range of 0.9~1.0 eV. Alternatively, after completion of the step of forming the CuInSe$_2$ based thin film on one conductive surface layer of the substrate, a CuInSe$_2$ thin film sample produced at the same time is cooled to the temperature of liquid helium. The sample is then irradiated with laser light so that luminescence radiation emitted from the sample at that time is measured. Processing of the CuInSe$_2$ based thin film solar cell is continued to a succeeding step when the maximum luminous intensity, within a spectral range of 0.8~0.9 eV of the luminescent radiation, exceeds a predetermined value or is greater than the maximum luminous intensity within the spectral range of 0.9~1.0 eV. Preferably, an Ar laser or He-Ne laser is used as a light source for the irradiation.

With respect to the CuInSe$_2$ based thin film used as an active layer of the thin film solar cell, it is not known what kind of lattice defect is not desirable or what energy level of a lattice defect within the band gap is desirable. Accordingly, results of various conventional analyses and observational studies cannot reveal the characteristic (efficiency) of the manufactured CuInSe$_2$ based thin film solar cell. Although photoluminescence has been related to the luminous characteristic of a luminous material, a luminous spectrum, or energy states or levels within the band gap, the relationship between photoluminescence and quality of the CuInSe$_2$ based film has not been known. However, since the present inventors have discovered that photoluminescence measurements are useful in determining the suitability of processed CuInSe$_2$ based thin films as active layers of solar cell, in the present invention, photoluminescence is used as an analytical method for characterizing CuInSe$_2$ thin film solar cells.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 1 shows the process of manufacturing the $CuInSe_2$ thin film solar cell according to an embodiment of the present invention;

FIG. 3 shows the process of manufacturing a conventional $CuInSe_2$ thin film solar cell;

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

FIG. 1 shows the process steps for manufacturing a $CuInSe_2$ thin film solar cell according to an embodiment of the present invention. In particular, FIG. 1 includes the step of measuring photoluminescence of a test piece after film formation.

Figure 4:
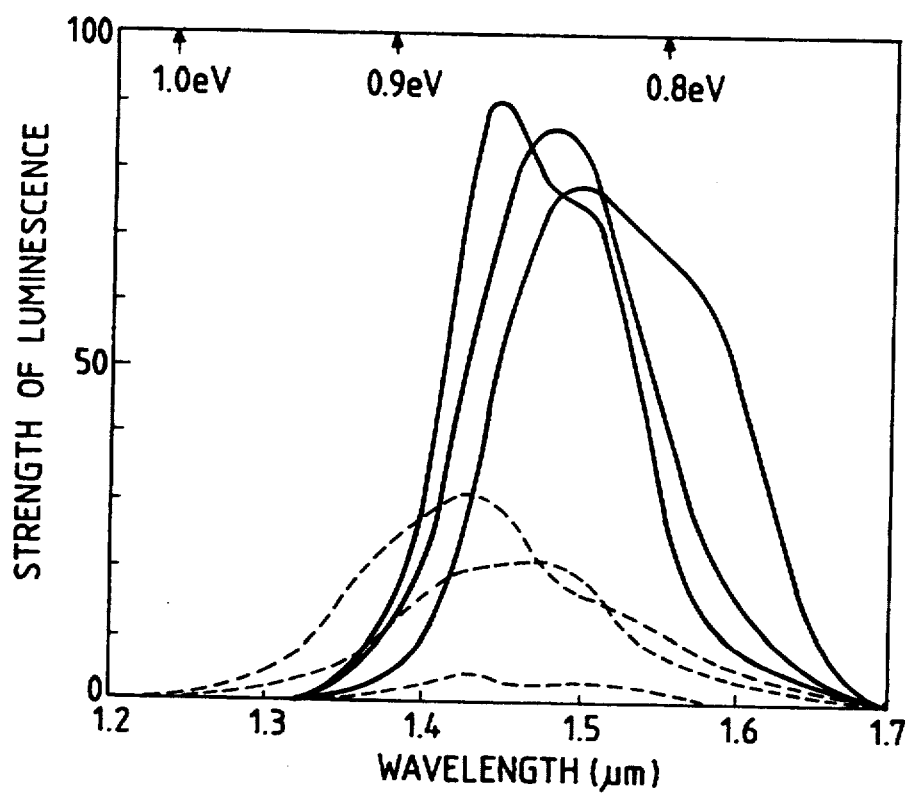
FIG. 4 shows the photoluminescence spectra of the $CuInSe_2$ thin film at 77K.

FIG. 4 shows plots of the photoluminescence spectra measurement of 6 lots of $CuInSe_2$ films shown in Table 1. The conditions of these measurements are as follows:
  (1) Excitation light: Ar laser light (514.5 nm), 10~300 mW
  (2) Sample temperature: 77K (dipped in liquid nitrogen)
  (3) Measured wavelength range: 1~1.7 μm
  (4) Detector: Ge detector In FIG. 4, solid lines show the spectra of three lots each having a good characteristic in which conversion efficiency η is about 10%. Dotted lines show the spectra of three lots each having poor characteristic in which conversion efficiency η is less than 0.1%. The luminescence intensity of the lots each having good characteristics is higher than the lots having the poor characteristics. Further, the lots having the good characteristic have strong luminescence in the spectral range of 0.8~0.9 eV and extremely weak luminescence in the spectral range of 0.9~1.0 eV. In the lots having the poor characteristic, the relatively strong luminous components exist within a range of 0.9~1.0 eV.

Figure 5:
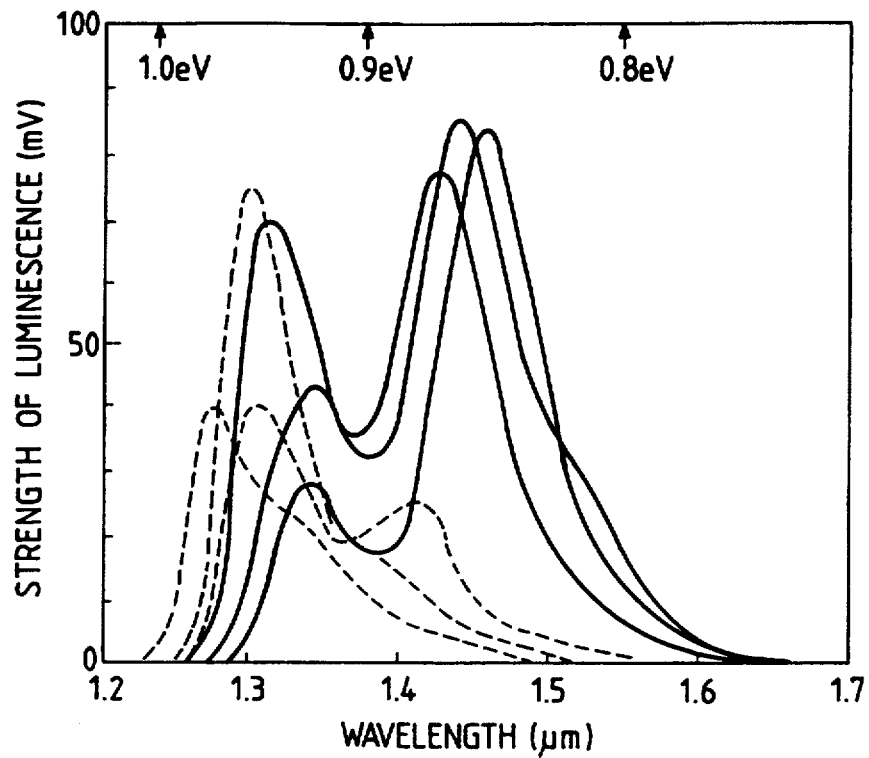
FIG. 5 shows the photoluminescence spectra of the $CuInSe_2$ thin film at 4.2K.

FIG. 5 shows photoluminescence spectra of 6 lots of $CuInSe_2$ films which were measured under the same conditions as those described above except that the sample temperature was lowered to 4.2K by dipping the $CuInSe_2$ films in liquid helium. In FIG. 5, solid lines and dotted lines are similarly distinguished from each other as in FIG. 4. Unlike the above described photoluminescence measurements performed at a sample temperature of 77K, the lots of the $CuInSe_2$ in this example have luminescent intensity peaks in both the 0.9~1.0 eV and the 0.8~0.9 eV spectral ranges. However, in the lots having the poor characteristic, the peak intensity in the spectral range of 0.9~1.0 eV is higher than the peak intensity in the spectral range of 0.8~0.9 eV. On the other hand, in lots having the good characteristic, the peak intensity in the spectral range of 0.8~0.9 eV is higher than the peak intensity in the spectral range of 0.9~1.0 eV.

Thus, although a significant difference between nondefective and defective lots could not be found in conventional methods for investigating the composition and structure of the $CuInSe_2$ film, a significant difference in photoluminescence was found between lots having good and bad characteristics. Thus, photoluminescence is an accurate means of determining the characteristics or efficiency of the $CuInSe_2$ solar cell. It is believed that the reason such a significant difference was obtained by the photoluminescence analysis of the present invention, while conventional analyses failed to yield any significant results, is that photoluminescence can detect with great sensitivity the presence of defects in a crystal lattice or a defect in a crystal grain boundary. The luminescence of the $CuInSe_2$ film in the range of 0.8~1.0 eV has energy slightly less than the optical band gap of $CuInSe_2$, which is approximately 1.0 eV. This is because light generating carriers are trapped at a shallow energy level in the band gap. Light is emitted when these carriers (e.g., trapped electrons) combine with holes. The shallow level is caused by a defect in the crystal lattice. Further, it is believed that a defect in a crystal grain boundary can act as a recombination center. Recombination with the defect is not a light emitting transition. Accordingly, if carriers recombine with the defect in the crystal grain boundary instead of with a carrier of the opposite type, light is not emitted. Thus, the presence of defects in the crystal grain boundary can reduce luminescent intensity.

In accordance with the method set forth in FIG. 1, lots can be selected on the basis of the results of the photoluminescent analysis and the ratio of non-defective to defective products can be improved. In the method of intermediate estimation, one of a plurality of substrates upon which the $CuInSe_2$ films have been deposited is designated a test piece and subjected to the same processing conditions as the remaining substrates upon which thin film solar cells are formed. The test piece is dipped in liquid nitrogen and then irradiated with laser light to estimate which lots have the maximum luminous intensity of a predetermined value. For example, the lots may be found non-defective if upon irradiation the photodetector (detecting the luminous radiation intensity from the $CuInSe_2$ film) outputs a voltage (proportional to the luminous radiation intensity) of at least 50 mV in the luminescent spectral range of 0.8~0.9 eV of photon energy during the photoluminescent analysis. If the photodetector does not generate such a voltage over this spectral range, the lots are defective. The defective lots are not processed further. In addition, only lots in which the maximum luminous intensity in the range of 0.8~0.9 eV of photon energy is higher than that in the range of 0.9~1.0 eV may be selected as non-defective lots, while lots not meeting this criteria may be found to be defective. If the test piece is dipped in liquid helium, lots having a maximum luminous intensity, upon irradiation, corresponding to a photodetector output voltage not lower than 50 mV in the photoluminescent spectral range of 0.8~0.9 eV or having the luminous intensity higher than the maximum luminous intensity in the spectral range of 0.9~1.0 eV are selected to be non-defective lots. It is apparent from Table 1 that if lots having a good characteristic can be selected, a solar cell incorporating the non-defective lots and having a conversion efficiency $\eta$ of about 10.0% can be manufactured. The result of such intermediate estimation can be used to determine optimum processing conditions for forming the $CuInSe_2$ film and thereby further improve the ratio of non-defective products.

Figure 6:
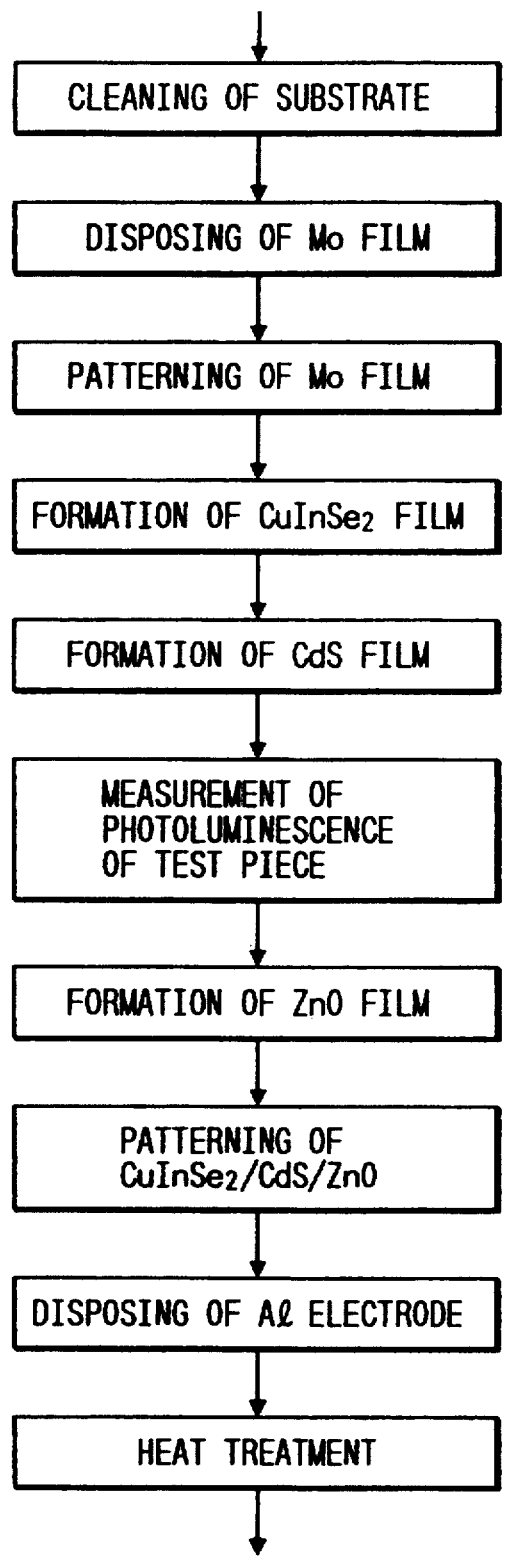
FIG. 6 shows the process of manufacturing the $CuInSe_2$ thin film solar cell according to another embodiment of the present invention.

N-type CdS film 4 or an n-type CdZnS film formed on p-type $CuInSe_2$ film 3 allows both excitation light of photoluminescence (having a wavelength of 514.5 nm) and the luminescence light emitted from the $CuInSe_2$ film to pass through without substantial absorption. Accordingly, as shown in FIG. 6, the measurement of photoluminescence may be performed after either the CdS film or the CdZnS film is formed. Similarly, photoluminescent measurements may be performed after ZnO film 5 is formed. Further, measurement of the photoluminescence may be performed after heat treatment which is the last step of cell manufacture.

Figure 2:
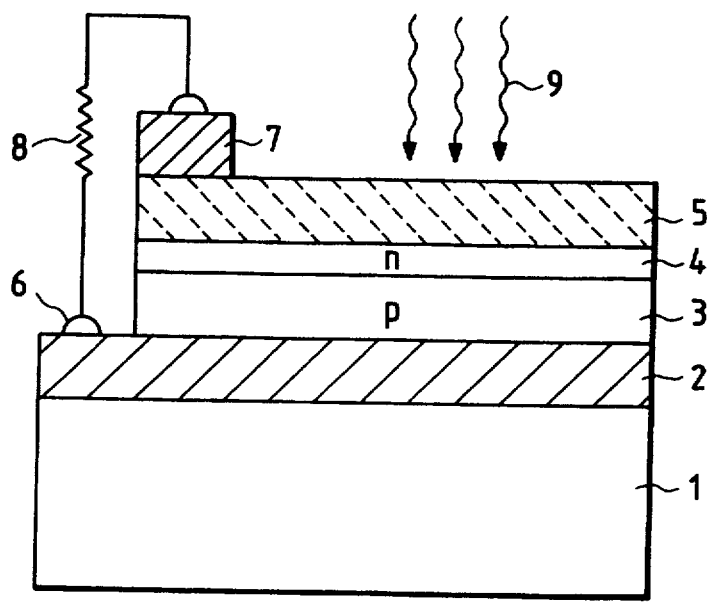
FIG. 2 is a sectional view of the solar cell showing structural components related to the present invention.
Figure 7:
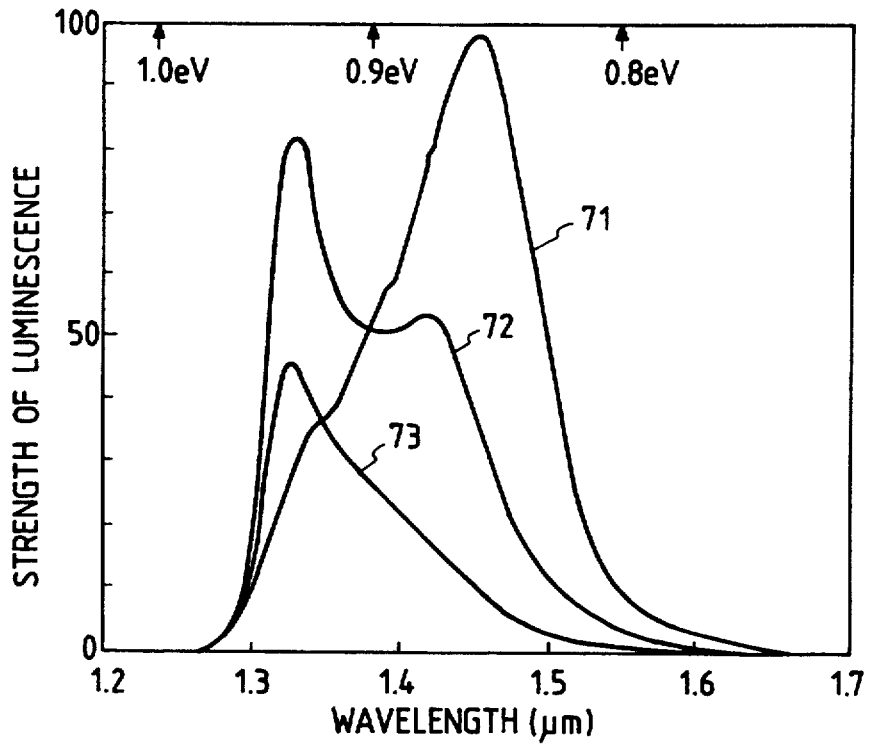
FIG. 7 shows the photoluminescence spectra of the $CuInSe_2$ film at 4.2K after completion of the $CuInSe_2$ thin film solar cell.

FIG. 7 shows spectra of photoluminescence measured after cells are manufactured. According to another embodiment, the solar cell shown in FIG. 2 may be manufactured in accordance with the process shown in FIG. 6 in which the photoluminescent analysis is performed after deposition of the CdS film. As Shown in FIG. 6, a p-type $CuInSe_2$ film is formed on Mo electrode film 2 which has been deposited on glass substrate 1. Next, n-type CdS film 4 having a thickness of about 1.0 $\mu$m is formed on p-type $CuInSe_2$ film 3. ZnO film 5 having a thickness of about 1.0 $\mu$m is then formed on n-type CdS film 4. Photoluminescence spectra, shown by lines 71, 72 and 73 in FIG. 7, were obtained by irradiation with light output from an Ar laser. This light has a wavelength of 514.5 nm. Three thin film solar cells manufactured in the same process and subjected to a temperature of 4.2K (liquid helium) were irradiated with light at this wavelength which passes through ZnO film 5 of each of these solar cells. The conversion efficiencies of these solar cells represented by the photoluminescence spectra of lines 71, 72, and 73 are 10.0%, 8.5%, and 0.1%, respectively. The conversion efficiency of a cell has been found to be high when a luminous peak in the range of 0.8~0.9 eV is stronger than that in the range of 0.9~1.0 eV.

Thus, in this embodiment, photoluminescence measurements are performed on completed $CuInSe_2$ thin film solar cells. Accordingly, the photoluminescent measurement can be used as a method for characterizing and selecting non-defective $CuInSe_2$ thin film solar cells.

Other excitation light sources may be used for the photoluminescence measurement. In addition to the Ar laser described above, a He-Ne laser having a wavelength of 633 nm may be used, or any other laser having a photon energy of not less than 1 eV, i.e., sufficient for carrier excitation in the $CuInSe_2$ film. However, the predetermined value of the maximum luminous intensity in the spectral range of 0.8~0.9 eV can vary according to the source of the excitation light.

Further, even in cases where portions of the active layer include $CuInSe_2$ in which either In is substituted by Ga or Se is substituted by S, the above described photoluminescence analysis may be similarly applied to characterize the solar cell including the substituted $CuInSe_2$ film.

Moreover, the present invention can be applied to and implemented with the other processes, in addition to the three-source simultaneous deposition, for fabricating a $CuInSe_2$ active layer such as a two-step selenidation method, a selenidation method using $H_2Se$, a sputtering method, a spraying method, and an electrodeposition method.

According to the present invention, photoluminescence is employed for estimating the quality of the $CuInSe_2$ based thin film so that the characteristic of the thin film solar cell using a $CuInSe_2$ based thin film active layer can also be estimated. Accordingly, defective lots can be removed in an intermediate step during the manufacturing process prior to completion of the device. Further, the film forming process can be controlled by using the result of the photoluminescence measurement to optimize processing conditions. As a result, the number of non-defective products in manufacturing the $CuInSe_2$ based thin film solar cells has been increased. Additionally, the photoluminescence analysis in accordance with the present invention may be used for ranking $CuInSe_2$ based thin film solar cell products.

Other embodiments of the invention will be apparent to those skilled in the art from consideration of the specification and practice of the invention disclosed herein. It is intended that the specification and examples be considered as exemplary only, with a true scope and spirit of the invention-being indicated by the following claims.

What is claimed is:

1. A method of characterizing a $CuInSe_2$ based thin film solar cell, comprising the steps of:
    irradiating a $CuInSe_2$ based thin film layer, at 10° K., with radiation having an energy not less than 1 eV per photon;
    detecting a first peak value of luminous intensity of radiation emitted by said $CuInSe_2$ layer, at 10° K. in response to said radiation over a first spectral range;
    detecting a second peak value of luminous intensity of radiation emitted by said $CuInSe_2$ layer in response to said radiation over a second spectral range; and
    comparing said first peak value with said second peak value to determine whether said first peak value exceeds said second peak value.

2. A method of characterizing a $CuInSe_2$ based thin film solar cell according to claim 1, further comprising the step of immersing the $CuInSe_2$ thin film in liquid helium.

3. A method of characterizing a $CuInSe_2$ based thin film solar cell according to claim 1, wherein said radiation having an energy not less than 1 eV per photon is substantially equal to 514.5 nm.

4. A method of characterizing a $CuInSe_2$ based thin film solar cell according to claim 1, wherein said radiation having an energy not less than 1 eV per photon is generated by an argon laser.

5. A method of characterizing a $CuInSe_2$ based thin film solar cell according to claim 1, wherein said radiation having an energy not less than 1 eV per photon is generated by a He-Ne laser.

6. A method of characterizing a $CuInSe_2$ based thin film solar cell according to claim 1, wherein said CuIn- Se$_2$ based thin film layer includes CuInSe$_2$ in which In is substituted with Ga.

7. A method of characterizing a CuInSe$_2$ based thin film solar cell according to claim 1, wherein said CuInSe$_2$ based thin film layer includes CuInSe$_2$ in which Se is substituted with S.

8. A method of characterizing a CuInSe$_2$ based thin film solar cell according to claim 1, wherein said first spectral range is 0.8 to 0.9 eV of photon energy and said second spectral range is 0.9 to 1.0 eV of photon energy.

9. A method of manufacturing a CuInSe2 base solar cell, comprising the steps of:
  forming a CuInSe2 active layer on a substrate;
  irradiating said CuInSe2 Active layer with light having a photon energy not less than 1 eV; and
  detecting a peak value of luminous intensity of light emitted by said CuInSe2 layer in response to said irradiation with light having a photon energy not less than 1.0 eV over a spectral range of 0.8–0.9 eV; and
  comparing said peak value with a reference value of luminous intensity to determine whether said peak value exceeds said reference value of luminous intensity.

10. A method of manufacturing a CuInSe$_2$ based solar cell, comprising the steps of:
  forming a CuInSe2 active layer on a substrate;
  irradiating said CuInSe2 active layer with light having a photon energy not less than 1.0 eV;
  detecting a first peak value of luminous intensity of light emitted by said CuInSe2 layer in response to said irradiation with light having a photon energy not less than 1.0 eV over a spectral range of 0.8–0.9 eV;
  detecting a second peak value of luminous intensity over a spectral range of 0.9–1.0 eV; and
  comparing said first and second peak values to determine whether said first peak value exceeds said second peak value.

11. A method of manufacturing a CuInSe$_2$ based solar cell, comprising the steps of:
  forming a CuInSe$_2$ active layer on a substrate;
  forming a film layer including a compound selected from the group of CdS and CdZnS over said active layer;
  irradiating said CuInSe$_2$ active layer with light having a photon energy not less than 1.0 eV through said film layer;
  detecting a peak value of luminous intensity of light emitted by said CuInSe$_2$ layer through said film layer in response to said irradiation with said light over a spectral range of 0.8–0.9 eV; and
  comparing said peak value of luminous intensity with a reference value of luminous intensity to determine whether said peak value exceeds said reference value of luminous intensity.

12. A method of manufacturing a CuInSe$_2$ based solar cell, comprising the steps of:
  forming a CuInSe$_2$ active layer on a substrate;
  forming a film layer including a compound selected from the group of CdS and CdZnS over said active layer;
  irradiating said CuInSe$_2$ active layer with light having a photon energy not less than 1.0 eV through said film layer;
  detecting a first peak value of luminous intensity of light emitted by said CuInSe$_2$ layer through said film layer in response to said irradiation with said light over a spectral range of 0.8–0.9 eV;
  detecting a second peak value though said film layer over a spectral range of 0.9–1.0 eV; and
  comparing said first peak value with said second peak value to determine whether said first peak value exceeds said second value.

13. A method of manufacturing a CuInSe$_2$ thin film solar cell, comprising:
  forming at least one conductive surface layer on a substrate;
  forming a CuInSe$_2$ thin film on said at least one conductive surface layer;
  irradiating said thin film with light having a photon energy not less than 1.0 eV at a predetermined temperature; and
  measuring a luminous intensity of luminescence light emitted from said thin film.

14. A method of manufacturing a CuInSe$_2$ based thin film solar cell according to claim 13, in which the light irradiation is performed on said CuInSe$_2$ thin film which is exposed.

15. A method of manufacturing a CuInSe$_2$ based thin film solar cell according to claim 13, in which the light irradiation is performed through a CdS or CdZnS thin film formed on said CuInSe$_2$ thin film which is formed on a substrate having opposite surface layers, at least one of which is conductive, said CuInSe$_2$ thin film being formed on said at least one conductive surface layer.

16. A method of manufacturing a CuInSe$_2$ based thin film solar cell according to claim 13, in which the light irradiation is performed through a CdS or CdZnS thin film formed on said CuInSe$_2$ thin film, and a ZnO thin film formed on said CdS or CdZnS thin film, said CuInSe$_2$ thin film being formed on a substrate having opposite surface layers, at least one of which is conductive, said CuInSe$_2$ thin film being formed on said at least one conductive surface layer.

17. A method of manufacturing a CuInSe$_2$ based thin film solar cell, comprising the steps of:
  forming at least one conductive surface layer on a substrate;
  forming a CuInSe$_2$ thin film on said at least one conductive surface layer;
  irradiating said thin film with light having a photon energy not less than 1.0 eV at a temperature of 67° K. to 87° K. or a temperature not greater than 10° K.; and
  measuring a luminous intensity of luminescence radiation emitted from said thin film, and the manufacturing process proceeds to a succeeding step only if the maximum luminous intensity, in a range of 0.8~0.9 eV of a spectrum of said luminescence radiation, has a value not lower than a reference value.

18. A method of manufacturing a CuInSe$_2$ based thin film solar cell according to claim 17, in which the source of said light is an Ar laser.

19. A method of manufacturing a CuInSe$_2$ based thin film solar cell according to claim 17, in which the source of said light is a He-Ne laser.

20. A method of manufacturing a CuInSe$_2$ based thin film solar cell, comprising the steps of:
  forming at least one conductive surface layer on a substrate;
  forming a CuInSe$_2$ thin film on said at least one conductive surface layer;

irradiating said thin film with light having a photon energy not less than 1.0 eV at a temperature of 67° K. to 87° K. or a temperature not greater than 10° K.; and measuring a luminous intensity of luminescence radiation emitted from said thin film, and the manufacturing process proceeds to a succeeding step only if the maximum luminous intensity, in a range of 0.8~0.9 eV, of a spectrum of said luminescence is higher than that in a range of 0.9~1.0 eV.

* * * * *

UNITED STATES PATENT AND TRADEMARK OFFICE
CERTIFICATE OF CORRECTION

PATENT NO. : 5,399,504
DATED : March 21, 1995
INVENTOR(S) : Michio OHSAWA

It is certified that error appears in the above-indentified patent and that said Letters Patent is hereby corrected as shown below:

Claim 9, Column 9, Lines 11, 13, 14, 17 "CuInSe2" should read --$CuInSe_2$--.

Claim 10, Column 9, Lines 28, 29, 32, "CuInSe2" should read --$CuInSe_2$--.

Title, Line 1, "$CUINSE_2$" should read --$CuInSe_2$--.

Signed and Sealed this

Twentieth Day of June, 1995

BRUCE LEHMAN

Attest:

Attesting Officer

Commissioner of Patents and Trademarks